United States Patent
Dzung et al.

(10) Patent No.: US 8,914,250 B2
(45) Date of Patent: Dec. 16, 2014

(54) METHOD AND SYSTEM FOR POWERLINE LENGTH MEASUREMENT

(75) Inventors: Dacfey Dzung, Wettingen (CH); Mats Larsson, Baden-Dättwil (CH)

(73) Assignee: ABB Research Ltd, Zurich (CH)

( * ) Notice: Subject to any disclaimer, the term of this patent is extended or adjusted under 35 U.S.C. 154(b) by 858 days.

(21) Appl. No.: 13/152,926

(22) Filed: Jun. 3, 2011

(65) Prior Publication Data

US 2011/0251810 A1   Oct. 13, 2011

Related U.S. Application Data

(63) Continuation of application No. PCT/EP2009/065375, filed on Nov. 18, 2009.

(30) Foreign Application Priority Data

Dec. 3, 2008  (EP) ..................................... 08170552

(51) Int. Cl.
| | |
|---|---|
| G01R 13/00 | (2006.01) |
| G01B 7/02 | (2006.01) |
| G01B 7/14 | (2006.01) |
| G01B 21/02 | (2006.01) |
| G01R 31/02 | (2006.01) |

(52) U.S. Cl.
CPC ............... G01B 7/02 (2013.01); *G01R 31/021* (2013.01)
USPC ............................................ 702/72; 702/158

(58) Field of Classification Search
CPC ................................. G01B 7/02; G01R 31/021
USPC .................................................. 702/72, 158
See application file for complete search history.

(56) References Cited

U.S. PATENT DOCUMENTS

| | | | | |
|---|---|---|---|---|
| 4,397,548 | A | * | 8/1983 | McCormack ................. 356/5.01 |
| 5,321,632 | A | * | 6/1994 | Otsuji et al. ................... 702/159 |
| 2004/0246068 | A1 | * | 12/2004 | Stenberg ....................... 333/117 |
| 2006/0167642 | A1 | * | 7/2006 | Ferrer et al. .................... 702/79 |

OTHER PUBLICATIONS

Notification Concerning Transmittal of International Preliminary Report on Patentability (Forms PCT/IB/326 and PCT/IB/373) and the Written Opinion of the International Searching Authority (Form PCT/ISA/237) issued on Jun. 16, 2011, in the corresponding International Application No. PCT/EP2009/065375.

* cited by examiner

*Primary Examiner* — Janet Suglo
(74) *Attorney, Agent, or Firm* — Buchanan Ingersoll & Rooney PC

(57) ABSTRACT

A method and system are provided for determining a length quantity of a power transmission line, which connects a first location with a second location. A first signal having a first carrier frequency is provided at the first location. The first signal is transmitted from the first location to the second location via the power transmission line. A second signal having a second frequency is provided at the second location. A first phase difference between the first signal and the second signal is measured at the second location, and the length quantity is calculated from the measured phase difference. In the system, a second receiver at the second location is configured to receive the first signal having the first carrier frequency from the first location. A frequency generator creates the second signal having the second frequency at the second location. The receiver includes a phase detection device configured to detect a first phase difference between the second frequency and the first carrier frequency at the second location.

30 Claims, 4 Drawing Sheets

METHOD AND SYSTEM FOR POWERLINE LENGTH MEASUREMENT

RELATED APPLICATION

This application claims priority as a continuation under 35 U.S.C. §120 to PCT/EP2009/065375 filed on Nov. 18, 2009 designating the U.S., and under 35 U.S.C. §119 to EP 08170552.7 filed on Dec. 3, 2008, the entire contents of which are hereby incorporated by reference in their entireties.

FIELD

The present disclosure relates to a method and a system for determining a length quantity of a power transmission line, which connects a first location with a second location.

BACKGROUND INFORMATION

Power transmission lines expand their length due to thermal loading. A resulting sag of overhead lines is undesirable. As a result, the length or a length change of the power transmission lines may be monitored. An increase in length of overhead power transmission lines may lead to sag. Line sag of high voltage lines is important, as it may lead to line faults due to flashovers to close objects such as trees.

In Wide Area Monitoring (WAM) systems for AC power transmission grids, Phasor Measurement Units (PMUs) perform measurement of voltage and current phasors. U.S. 2007/0038396 discloses a method in which voltage and current phasors measured at two ends of a power transmission line are used to determine a line impedance, and specifically a line resistance. The resistance is a function of line temperature, so that the method provides a measurement of the average line temperature, which in turn affects the line length and its sag. The method requires synchronization of the PMUs.

Further, there are direct powerline sag measurement methods based on various principles, such as optical cameras, mechanical tension or inclination measurement (see, e.g., U.S. Pat. No. 5,235,861, U.S. Pat. No. 6,523,424, U.S. Pat. No. 6,205,867), thermal measurements using fibres (see, e.g., U.S. Pat. No. 6,776,522) or infrared cameras. These methods, however, only perform local measurements.

SUMMARY

An exemplary embodiment provides a method for determining a length quantity of a power transmission line, wherein the power transmission line connects a first location with a second location. The exemplary method includes providing a first signal having a first carrier frequency at the first location, and transmitting the first signal from the first location to the second location via the power transmission line. The exemplary method also includes providing a second signal having a second frequency at the second location, and measuring, in a processor of a computer processing device, a first phase difference between the first signal and the second signal at the second location. In addition, the exemplary method includes calculating, in the processor, the length quantity from the measured phase difference.

An exemplary embodiment provides a system for determining the length of a power transmission line between a first location and a second location. The exemplary system includes a second receiver at the second location configured to receive a first signal having a first carrier frequency from the first location. The exemplary system also includes a first frequency generator configured to create a second signal having a second frequency at the second location. The receiver includes a phase detection device configured to detect a first phase difference between the second frequency and the first carrier frequency at the second location.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
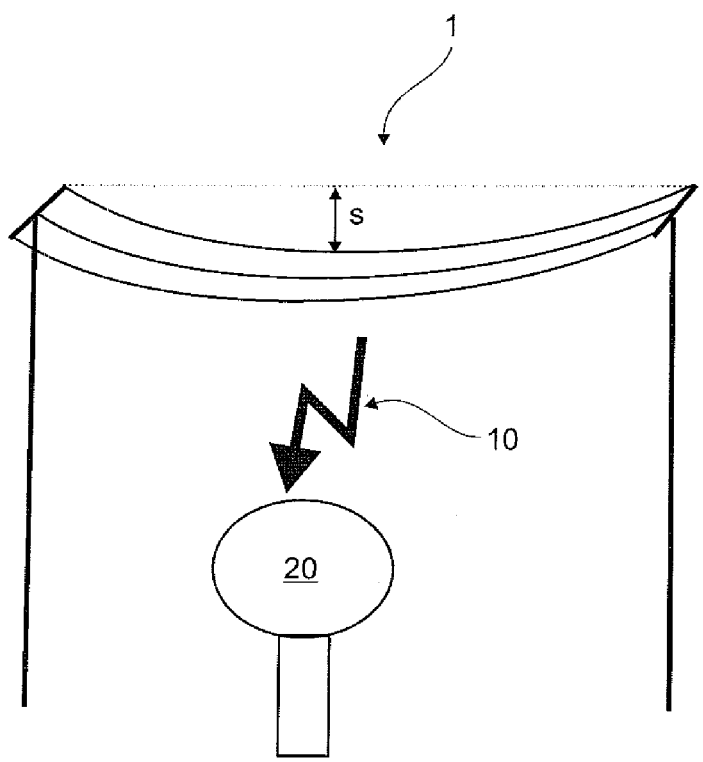
FIG. 1 shows a schematic of a power transmission line.

Exemplary embodiments of the present disclosure provide a simple and effective method and system for measuring a length quantity of a power transmission line.

An exemplary embodiment of the present disclosure provides a method for determining a length quantity of a power transmission line, wherein the power transmission line connects a first location with a second location. The exemplary method includes providing a first signal having a first carrier frequency at the first location, and transmitting the first signal from the first location to the second location via the power transmission line. The exemplary method also includes providing a second signal having a second frequency at the second location, and measuring a first phase difference between the first signal and the second signal at the second location. In addition, the exemplary method includes calculating the length quantity from the measured phase difference.

In accordance with an exemplary embodiment, the first signal with a first carrier frequency may be a sine wave. In accordance with the exemplary method, wherein a first signal that is transmitted from a first location to a second location, and the first signal is compared with a second signal at the second location, these steps may be applied remotely. Hence, local measurements of a sag, for example, in case of an overhead transmission line, may be avoided. In accordance with an exemplary embodiment, the first and/or the second position may be any position on the power transmission line, such as a network node, for example.

In accordance with an exemplary embodiment, the power transmission line can be an overhead power transmission line, for example.

In accordance with an exemplary embodiment, which may be combined with other embodiments disclosed herein, the first signal is a power line communication signal. Thus, existing signals from a powerline communication link may be used for the length measurement.

In accordance with an exemplary embodiment, the modulated user data may be compensated or eliminated.

The compensating or eliminating may include low-pass filtering of a phase signal obtained from a quadrature demodulator, squaring the received signal before demodulating and extracting or bandpass filtering the component at a frequency $2f_i$, and/or using a data detector to re-modulate and substrate the data-dependent phase contribution. $f_i$ may the carrier frequency of the first signal or the frequency of the second signal.

In accordance with an exemplary embodiment, which may be combined with other embodiments disclosed herein, the second frequency may be equal to the first carrier frequency, wherein frequency generators for generating the first carrier frequency at the first location and the second frequency at the second location are synchronized. A length variation of the power transmission line may be measured about a phase difference variation.

According to an exemplary embodiment, the frequency generators may be synchronized with a navigation satellite system, such as a Global Positioning System (GPS), Gallileo, IRNSS, GLONASS and the like.

In accordance with an exemplary embodiment, which may be combined with other embodiments disclosed herein, the length quantity may be the total length.

In accordance with an exemplary embodiment, the second frequency may be equal to the first carrier frequency, wherein the phase and the frequency of frequency generators for generating the first carrier frequency at the first location and the second frequency at the second location are synchronized. A total length may be measured.

The total length may be calculated from $$d = \lambda \frac{\psi + 2\pi N}{2\pi},$$

with ψ being the phase difference and λ being the wave length of the first carrier frequency, and d being the length, using a reasonable value for N. In accordance with an exemplary embodiment, the value for N may be estimated by a direct delay measurement, for example, by measuring a message delay between the first location and the second location, and the second location and the first location, respectively.

In accordance with an exemplary embodiment, which may be combined with other embodiments disclosed herein, the method may include providing a third signal with a third carrier frequency, transmitting the third signal from the second location to the first location, providing a fourth signal having a fourth frequency at the second location, and measuring a second phase difference between the third signal and the fourth signal at the second location. In accordance with an exemplary embodiment, this method may not require external synchronization.

By using the phase difference variation of the first and second phase difference, the length variation of the power transmission line may be measured.

In accordance with an exemplary embodiment, the third carrier frequency may be substantially equal to the first carrier frequency.

In accordance with an exemplary embodiment, the third carrier frequency may be different from the first carrier frequency.

In accordance with an exemplary embodiment, which may be combined with other embodiments disclosed herein, the first carrier frequency and the fourth frequency at the first location may be generated from the same local frequency source having a first base frequency. In addition, the third carrier frequency and the second frequency may be generated from the same local frequency source having a second base frequency. In accordance with an exemplary embodiment, a frequency source may be a frequency generator, an oscillator or the like.

In accordance with an exemplary embodiment, the first carrier frequency and/or the fourth frequency may be a multiple or a fraction of the first base frequency, respectively, and/or the third carrier frequency and/or the second frequency may be a multiple or a division of the second base frequency, respectively.

In accordance with an exemplary embodiment, the method may further include providing a third signal having a third carrier frequency at a first location, transmitting the third signal from the first location to a second location via the power transmission line, providing a fourth signal having a fourth frequency at the second location, and measuring the phase difference between the third signal and the fourth signal at the second location. The third carrier frequency may be different from the first carrier frequency. This exemplary embodiment may be used where the propagation speed of a signal with the first carrier frequency and the propagation speed of a signal with the third carrier frequency is substantial different.

In accordance with an exemplary embodiment, which may be combined with other embodiments disclosed herein, the first carrier frequency and/or the third carrier frequency is/are in the range of 10 kHz to 2000 kHz, for example, in the range of 20 kHz to 1000 kHz, such as in the range of 40 kHz to 500 kHz.

In accordance with an exemplary embodiment, the method may further include calculating the length of the power transmission line based on the measured first and/or second phase difference(s).

In accordance with an exemplary embodiment, which may be combined with other embodiments, the length quantity can be the relative change in length.

In accordance with an exemplary embodiment, the method can include calculating the absolute length of the power transmission line from the relative change in the length of the power transmission line and an estimate of an absolute length of the power transmission line.

In accordance with an exemplary embodiment, which may be combined with other embodiments disclosed herein, the estimate of an absolute length of the power transmission line can be performed by measuring a message delay between the first location and the second location, and the second location and the first location, respectively.

An exemplary embodiment of the present disclosure provides a method for determining the temperature of a power transmission line between a first location and a second location. The exemplary method includes determining the length of a power transmission line according to any of the other embodiments disclosed herein, and calculating the temperature of the power transmission line based on the length of the power transmission line between the first location and the second location.

An exemplary embodiment of the present disclosure provides a system for determining the length of a power transmission line between a first location and a second location. The system includes a second receiver at the second location which is configured to receive a first signal having a first carrier frequency from the first location. The system also includes a frequency generator for creating a second signal having a second frequency at the second location. The receiver further includes a phase detection device configured to detect a first phase difference between the second frequency and the first carrier frequency at the second location.

In accordance with an exemplary embodiment, the system is configured to perform a method according to the embodiments disclosed herein.

In a accordance with an exemplary embodiment, which may be combined with other embodiments disclosed herein, the system further includes a second transmitter at the second location having a frequency generator for creating a third carrier frequency of a third signal. The second transmitter is configured to send the third signal via the power transmission line to the first location.

In accordance with an exemplary embodiment, the second receiver and the second transmitter at the second location are configured to use a common frequency source for creating the third carrier frequency for the third signal and for creating the second signal. The common frequency source can have a second base frequency. For example, the third carrier frequency of the third signal can be a multiple or a division of the second base frequency, and/or the second frequency can be a multiple or a division of the second base frequency.

In accordance with an exemplary embodiment, which may be combined with other embodiments disclosed herein, the system includes at the first location a first receiver configured to receive the third signal from the second location. The system can also include a frequency generator at the first location for creating a fourth signal having a fourth frequency. In addition, the system can also include a phase detection device configured to detect a second phase difference between the fourth frequency and the third carrier frequency.

In accordance with an exemplary embodiment, the system can include a first transmitter at the first location having a frequency generator for creating the first carrier frequency of a first signal. The first receiver and the first transmitter at the first location can be configured to use a common frequency source for creating the first carrier frequency for the first signal and for creating the fourth signal. The common frequency source can have a first base frequency. For example, the first carrier frequency of the first signal can be a multiple or a division of the first base frequency, and/or the fourth frequency can be a multiple or a division of the first base frequency.

In accordance with an exemplary embodiment, which may be combined with other embodiments disclosed herein, the system can be configured to calculate the length of the power transmission line based on the measured first and/or second phase difference(s).

Exemplary embodiments of the present disclosure also provide apparatuses for carrying out the disclosed methods and include apparatus parts for performing described method steps. Furthermore, exemplary embodiments of the present disclosure are directed to methods by which the described apparatus operates or by which the described apparatus is manufactured. It may include method steps for carrying out functions of the apparatus or manufacturing parts of the apparatus. The method steps may be performed by way of hardware components, firmware, a computer having a processor programmed by appropriate software, by any combination thereof or in any other manner. For instance, exemplary embodiments of the present disclosure provide a non-transitory computer-readable recording medium (e.g., ROM, hard disk drive, optical memory, flash memory, etc.) on which a computer program is recorded that causes a processor a computer processing device (e.g., a CPU) to carry out any of the features described herein.

It is contemplated that elements of one embodiment may be advantageously utilized in other embodiments without further recitation.

In the following, a method for measuring a length quantity is generally described.

From the telegraph equation, a complex amplitude of a sine wave with frequency ω propagating on a homogenous transmission line in a direction d is $$e^{-\gamma d} = e^{-\alpha d} \cdot e^{-j\beta d} \tag{1}$$

where $$\gamma = \sqrt{(G' + j\omega C')(R' + j\omega L')} \approx \underbrace{\left(\frac{1}{2}R'\sqrt{\frac{C'}{L'}} + \frac{1}{2}G'\sqrt{\frac{L'}{C'}}\right)}_{\alpha} + \underbrace{j\omega\sqrt{L'C'}}_{\beta}. \tag{2}$$

In (2), R', G', C', and L' are the resistance, conductance, capacitance, and inductance per unit length of the transmission line, respectively, and the approximation is valid for a low loss line with R'<<ωL' and G'<<ωC'. This embodiment proposes to use signals to be transmitted from a first location to a second location, for example, from a first network node to a second network node, to measure various line parameters, such as the line length and line temperature, for example. In accordance with an exemplary embodiment, the carrier frequency of a powerline carrier communication (PLC) link is used.

To determine the temperature of the power transmission line, a relation between the length of the power line and the temperature may be established. Line resistance: R' and hence α increases roughly linearly against temperature, which translates to a decrease of the amplitude of the received signal, for example, a powerline communication (PLC) signal, by $e^{-\alpha d}$. Due to the skin effect, R' is considerably larger for high frequency signals, e.g. PLC signals, than for the 50/60 Hz AC power. However, the temperature-dependency is likely to be the same for the given transmission line. Given the amplitude of the transmitted signal, the receiver can measure the attenuation and thus determine the resistance R'. An average line temperature $T_1$ may be determined from the ohmic resistance R' by a relationship between the temperature and the resistance. The relationship may be linear e.g. $R'=R_2+k_1(T_1-T_2)$, or quadratic $R'=R_2+k_1(T_1-T_2)+k_2(T_1-T_2)^2$, wherein $R_2$ and $T_2$ are a known reference and temperature values dependent on the construction of the line and $k_1$ and $k_2$ are material constants for the power line cable. Thus, the average line temperature can be inferred from this measured average line resistance. For example, the thermal resistance coefficient of aluminium is $4 \cdot 10^{-3}$ $K^{-1}$, so that an increase in the resistance R' by 12% implies a temperature increase of 30° C. In accordance with an exemplary embodiment, the mapping from the measured electrical parameters such as R' to average line temperature, given the weather dependency in particular of G', is discussed in U.S. 2007/0038396, which is incorporated herein by reference. The line temperature in turn determines the line length, as given by the thermal expansion coefficient.

There is an increase in line length d due the thermal expansion. The linear thermal expansion coefficient, e.g. of steel is $17.3 \cdot 10^{-6}$ $K^{-1}$, and hence the thermal increase in length d is negligible against the thermal increase in R' in the term R'·d in equation (2). The length increase may be directly measured using a signal transmitted on the power transmission line:

In the following, a method to measure the line length d is described. According to the last term in equation (2), the complex amplitude of the sine wave is rotated by $e^{-j\beta d}=e^{-j\psi}$, i.e. the phase $\psi$ of the sine wave of frequency $f=\omega/2\pi$ at position d is $$\psi = \omega\sqrt{L'C'}\,d = \omega\frac{d}{c} = 2\pi\frac{d}{\lambda} \quad (3)$$

where $c=1/\sqrt{L'C'}$ is the propagation speed on the transmission line, and $\lambda=c/f$ is the wavelength of the sine wave. Therefore, a change of the relative phases between the end points of a transmission line indicates a change in the line length. According to an exemplary embodiment, the phase of a carrier frequency, for example the carrier phase of power line communication signals, is measured for determining the line length. Power line communication (PLC) signals employed on high voltage transmission lines can have carrier frequencies in the range of f=100 kHz to 500 kHz, e.g., wavelengths of $\lambda=c/f\approx400$ m to 2000 m. A phase measurement resolution of $\Delta\psi=1°$ achieves a length resolution of 5.5 m or better. On a steel line length of d=100 km, given the thermal coefficient of steel of $17.3\cdot10^{-6}$ K$^{-1}$, this corresponds to a temperature resolution of 3° C.

Phase measurement at a given receiver location is performed by comparing the phase of the received signal with the phase of a locally generated signal. Generally, it is difficult to distinguish the wanted effect of line length from the effect of unknown phase offsets between the transmitter and receiver frequency sources (oscillators).

So that the manner in which the above recited features of the present disclosure can be understood in detail, a more particular description of the disclosure, briefly summarized above, may be had by reference to exemplary embodiments described in further detail below. It is to be noted, however, that the appended drawings illustrate only exemplary embodiments of the present disclosure and are therefore not to be considered limiting of its scope, for the disclosure may admit to other equally effective embodiments.

FIG. 1 shows a power transmission line 1 with three phases. The power transmission line 1 is an overhead power transmission line with three phases. Due to a temperature increase of the power transmission line 1, a sag s may increase. If the sag s of the high voltage line is too big, a flashover 10 to close objects like a tree 20 may occur. This may lead to a power transmission line fault. The sag s increases when the power transmission line length increases. In turn, the power transmission line length is dependent on the temperature of the power transmission line 1. Therefore, it is important for a power network operator to monitor the length of a power transmission line.

Generally, in the following, w is used for the angular frequency and f for the normal frequency, where $\omega=2\pi f$.

Figure 2:
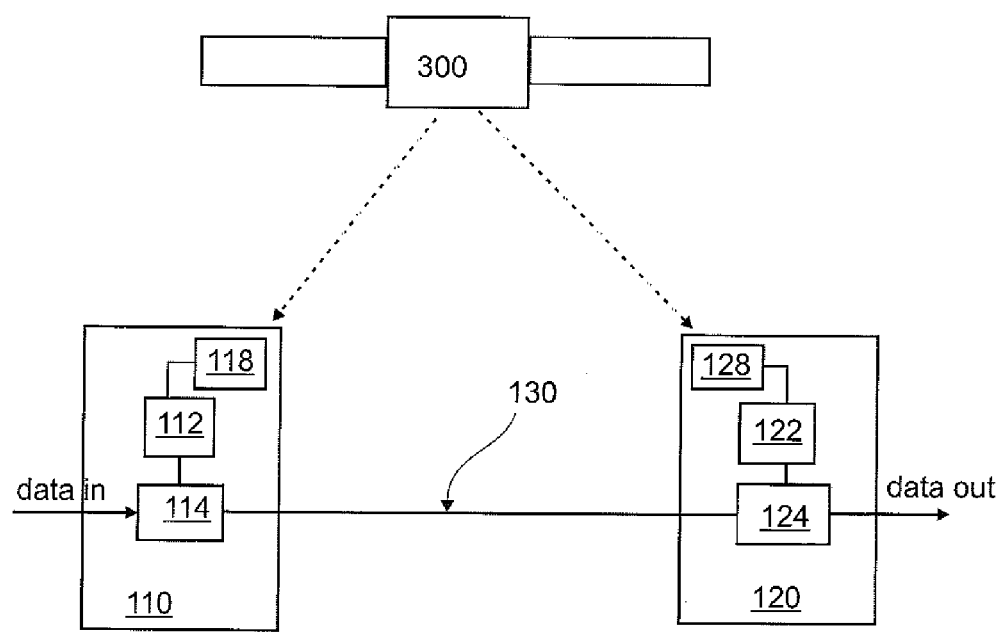
FIG. 2 shows a schematic drawing of an exemplary embodiment of a system for detecting the length of a power transmission line.

FIG. 2 shows an exemplary embodiment of a system 100 for measuring the length of a power transmission line 1. A first network node 110 is connected to second network node 120 with a power transmission line 130. In the first network node 110, a first signal with a first carrier frequency $f_1$ is generated using the first frequency generator or oscillator 112 and modulating incoming data in a modulator 114. The modulated data or first signal is then transmitted via the power transmission line 130 to the second network node 120. The first signal has therefore a first carrier frequency. In accordance with another embodiment, no data is modulated such that a simple sine wave with the carrier frequency $f_1$ of the first frequency generator 112 is transmitted over the power transmission line 130 to the second network node 120. In accordance with an exemplary embodiment, the frequency generator 112 may replaced by an oscillator. In another embodiment, which may be combined with other embodiments disclosed herein, a frequency $f_0$ generated by the frequency generator or oscillator may be multiplied or divided using a frequency multiplier or divider for generating the frequency $f_1$ before the data to be transmitted is modulated with that frequency $f_1$. The first signal which is transmitted over the power transmission line 130 arrives with a delay r at the second network node 120. The delay d may be calculated from the phase difference between a locally generated second signal with the frequency $f_1$ and the received first signal with the first carrier frequency $f_1$ at the second network node 120. From the phase difference, the length of the power transmission line 130 may be deduced (determined), for example, by a processor of a computer processing device, either at the node or remote from the node. The second network node 120 includes a second oscillator or a frequency generator 122 for providing the second frequency $f_1$ that is equal to the first carrier frequency $f_1$ at a demodulator 124.

Figure 3:
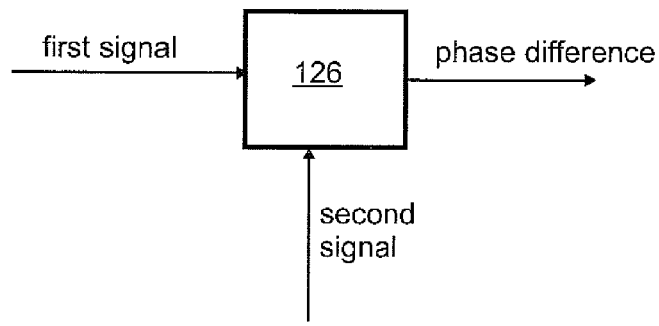
FIG. 3 shows a schematic drawing of a phase detector according to an exemplary embodiment of the present disclosure.

The demodulator 124 in the second network node 120 may include a phase detector 126 as shown in the exemplary embodiment of FIG. 3. The phase detector 126 may include a frequency mixer or an analog multiplier circuit, and a low pass filter for generating a voltage signal which represents the difference in phase between the first signal and the second signal.

In accordance with an exemplary embodiment, the frequency generators 112, 122 in the first and second network node 110, 120 may be synchronized. This may be done by satellite signals such as from a GPS satellite 300. Therefore, the first and second network node 110, 120 may include a GPS receiver 118, 128, respectively. In accordance with other exemplary embodiments, other methods may be used to provide a synchronization of the frequency generators 112, 122 in the first and second network node.

Thus, according to an exemplary embodiment, a clock of an oscillator in a first network node 110 for transmitting the first signal with the carrier frequency $f_1$ to the second network node 230 and the clock of an oscillator or frequency generator in a second network node 120 are synchronized. For example, the frequency for modulating and demodulating in the first and second network node are synchronized and generally equal. Thus, the absolute phases can be measured (up to an ambiguity of $N\cdot2\pi$, wherein N is a natural number) and the length d of the power transmission line can be calculated directly using equation (3). According to an exemplary embodiment, the absolute phase difference of the first signal at the first network node and at the second network node may be measured, if the also the phases of the frequency generators in the first network node and the second network node are synchronized or locked. For instance, to estimate the value of N, the length of the power carrier line may be estimated using a direct delay measurement method. An example of such a direct delay measuring method is described below.

In accordance with an exemplary embodiment, wherein the phases of the frequency generators in the first and second network nodes are not synchronized, but the frequencies of the frequency generator in the first and second network nodes are synchronized, generally only a length variation of the power transmission line may be measured via a phase difference variation.

Figure 4:
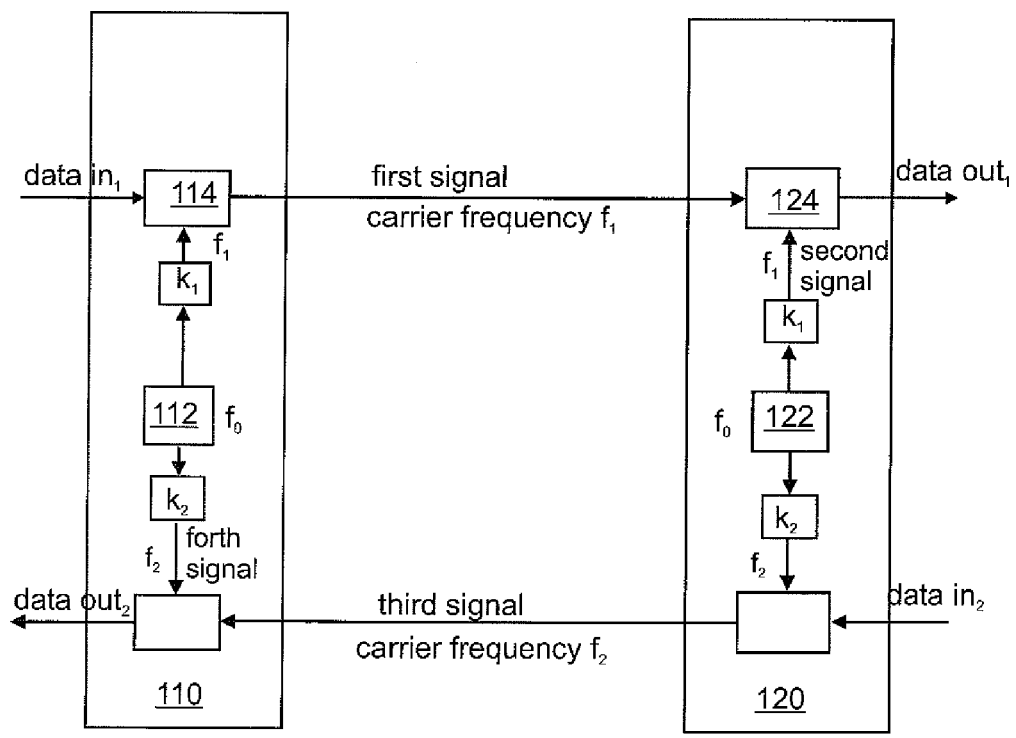
FIG. 4 shows a schematic drawing of an exemplary embodiment of a system for detecting the length of a power transmission line.

In accordance with an exemplary embodiment, which will be described in the next sections with reference to FIG. 4, the frequency differences in an unsynchronized system can be simultaneously estimated, and therefore the desired length d of the power transmission line can be determined. This may be implemented, in accordance with an exemplary embodiment, using a power line communication (PLC) system. Generally, PLC systems use continuous frequency duplex transmissions. A duplex transmission is a bi-directional transmission, e.g., at the same time a first transmission from the first network node to second network and a second transmission from the second network node to the first network node take place. FIG. 4 shows a first network node 110 and a second network node 120.

The first network node 110 transmits to the second network node 120 a first signal on frequency $\omega_1 = 2\pi f_1$, as shown in the upper part of FIG. 4. The frequency $\omega_1$ is therefore a carrier frequency of the first signal. Omitting any PLC data modulation for the moment, the transmitted signal is a sine wave, $$x_1(t) = \cos(\phi_1(t)) = \text{Re}(e^{j\phi_1(t)}) \quad (4)$$

where $\phi_1(t) = \omega_1 t + \phi_1^0$.

For the described method, it is not necessary to send data from the first network node 110 to the second network node 120. The measurement of the length of the power transmission line may, in accordance with an exemplary embodiment, use signals without transporting data. This means that the first signal $x_1(t)$ is sent from the first network node 120 and received at the second network node 120 after a propagation delay of $\tau$. The propagation delay $\tau$ leads to a phase change of $-\omega_1 \tau = -\omega_1 \cdot d/c_1$, where $c_1$ is the known speed of propagation for the frequency $\omega_1$, and d is the distance (length of the power transmission line) to be determined. According to an exemplary embodiment, the speed of propagation c can be approximately $2 \cdot 10^8$ m/s, and only weakly dependent on frequency of the signal to be transmitted from the first network node 110 to the second network node 120, such as for lossless or low loss lines, for example. The demodulator at the second network node 120 "down-mixes" (e.g. multiplies and filters) or demodulates the received first signal with a locally generated second signal having a second frequency $\omega_1' = 2\pi f_1'$, in order to shift the high-frequency first signal to the base band, as it will be described in more detail below. According to an exemplary embodiment, the oscillator or frequency generator 122 at the second network node 120 generates the same frequency $\omega_1'$ as the oscillator or frequency generator 112 at the first network node 110 generating the frequency $\omega_1$. In practice, however, $\omega_1' = \omega_1 + y \cdot \omega_1$, where y is a small relative frequency error, typically $y \approx 10^{-6}$ (1 ppm).

In complex notation, the first signal demodulated with the second signal corresponds to $$\text{Re}[z_1(t) \cdot \exp(-j(\omega_1' t + \psi_1^0))] \quad (5)$$

where $z_1(t) = x_1(t-\tau)$. In equation (5), noise and distortion effects are neglected. It may be seen that $(\omega_1' t + \psi_1^0)$ is subtracted from the received phase due to the demodulation or frequency mixing of the received first signal with the second signal. $\psi_1^0$ accounts for the unknown relative phase between the transmitter and receiver oscillators. The phase after the demodulator is thus $$\psi_1(t) = \varphi_1(t) - \omega_1 \frac{d}{c_1} - (\omega_1 t + \psi_1^0) = (\omega_1 - \omega_1)t - \left(\omega_1 \frac{d}{c_1} - \varphi_1^0 + \psi_1^0\right) \quad (6)$$

In addition to the wanted parameter d, e.g., the length of the power transmission line, the received phase $\psi_1(t)$ contains the unknown nuisance parameters $(\omega_1' - \omega_1)$ and $(-\phi_1^0 + \psi_1^0)$, due to the frequency and phase offsets from the frequency generator in the first network node and the frequency generator in the second network node. As there may be many unknown causes contributing to the phase offset $(-\phi_1^0 + \phi_1(t)_1^0)$, it may not be possible in practice or practical to recover the absolute length of the transmission power line d from the measured phase in (6). It is, however, possible to measure the relative change in the length d of the transmission power line from $\phi_1(t)$, if the frequency offset $(\omega_1' - \omega_1)$ can be compensated. The following describes a method to estimate d or a relative change in d, while taking any frequency offset into account.

In accordance with an exemplary embodiment, a second measurement of a phase difference may be performed in the reverse direction and/or on a different frequency. For example, a second measurement of a phase difference can be performed on the same power transmission line using a third signal that is sent from the second network node 120 to the first network node 110. This is shown in the lower part of FIG. 4.

A continuous PLC signal or another third signal is transmitted from the second network node 120 with the third carrier frequency $\omega_2'$. The phase of the transmitted phase is thus $$\phi_2(t) = \omega_2' t + \phi_2^0.$$

Using the same derivation as above, the phase or the phase difference of the demodulated third signal in the first network node 110 is $$\psi_2(t) = \varphi_2(t) - \omega_2 \frac{d}{c_2} - (\omega_2 t + \psi_2^0) = (\omega_2 - \omega_2)t - \left(\omega_2 \frac{d}{c_2} - \varphi_2^0 + \psi_2^0\right) \quad (7)$$

In the first network node 110 and in the second network node 120, the frequencies for modulating the third signal (the carrier frequency $\omega_2$ of the third signal) or demodulating the first signal (i.e. the frequency of the second signal $\omega_1'$), or the frequencies for modulating the first signal (the carrier frequency $\omega_1$ of the first signal) and demodulating the third signal (i.e. the frequency of the fourth signal $\omega_2$) may be derived from the same frequency source, or from synchronized or the same frequency generators. Thus, it is possible to relate $(\omega_1 - \omega_1')$ to $(\omega_2' - \omega_2)$ using the frequency errors. In both nodes, the frequencies $f_i = \omega_i/2\pi$ and fi' are derived from local oscillators generating reference or base frequencies $f_0$ and $f_0'$, in the first network node 110 and the second network node 120, respectively.

$$f_1 = k_1 f_0, f_1' = k_1 f_0'$$

$$f_2 = k_2 f_0, f_2' = k_2 f_0' \quad (8)$$

Frequency multipliers or dividers $k_1$ and $k_2$ may be implemented, in a accordance with an exemplary embodiment, in the first network node 110 and the second network node 120. Therefore, they are known constants, and the same in both nodes. All frequency errors are thus proportional to the difference $f_0' - f_0$, $$f_0' - f_0 = f_0(1+y) - f_0 = y f_0 \quad (9)$$

where y denotes the relative frequency offset of $f_0'$ with respect to $f_0$.

Therefore $$(\omega_1 - \omega_1') = -y\omega_1 \text{ and } (\omega_2' - \omega_2) = y\omega_2.$$

Inserting this into equation (6) and equation (7) yields $$\psi_1(t) = -y\omega_1 t - \omega_1 \frac{d(t)}{c_1} + (\varphi_1^0 - \psi_1^0) \quad (10)$$

$$\psi_2(t) = +y\omega_2 t - \omega_2' \frac{d(t)}{c_2} + (\varphi_2^0 - \psi_2^0) \quad (11)$$

$\psi_1(t)$ and $\psi_2(t)$ are the phase differences between the received first and second signal at the second network node 110 ($\psi_1(t)$), and between the received third and the fourth signal at the first network node 120 ($\psi_2(t)$). These two measurements allow to eliminate the unknown frequency offset y: Solving equations (10) and (11) for d(t), while taking advantage of fact that the frequency offset is small ($|y|\ll 1$), so that $\omega_2' \approx \omega_2$, yields $$d(t) = -\frac{\frac{\psi_1(t)}{\omega_1} + \frac{\psi_2(t)}{\omega_2}}{\frac{1}{c_1} + \frac{1}{c_2}} + \frac{\frac{(\varphi_1^0 - \psi_1^0)}{\omega_1} + \frac{(\varphi_2^0 - \psi_2^0)}{\omega_2}}{\frac{1}{c_1} + \frac{1}{c_2}} \quad (12)$$

The length may also obtained in an exemplary embodiment, where the frequency generators in the first network node 110 and the second network node 120 are synchronized, e.g. by Global Positioning System (GPS) signals. The second term on the right hand side of equation (12) is constant in time and due to the absolute phases. It may only be measured with exactly synchronized clocks. However, in practice it is sufficient to measure only a relative change in the length d(t), as given by the first term in equation (12), i.e.

$$\hat{d}(t) = -\frac{\frac{\psi_1(t)}{\omega_1} + \frac{\psi_2(t)}{\omega_2}}{\frac{1}{c_1} + \frac{1}{c_2}}. \quad (13)$$

In the illustrative special case of $\omega_1 = \omega_2 = \omega$, that means the same carrier frequency is used for the first and the third signal, $$\hat{d} = -\frac{c}{\omega} \frac{\psi_1 + \psi_2}{2}, \quad (14)$$

e.g., d is obtained from the average of the two measurements, as a generalization of equation (3).

Figure 5:
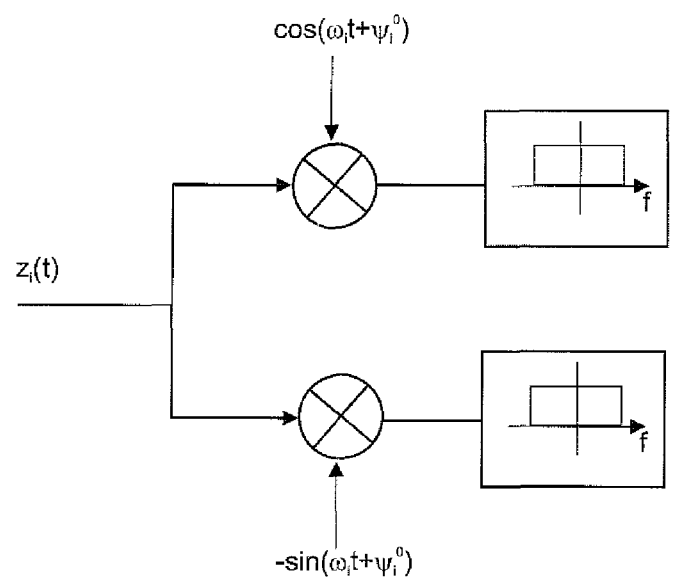
FIG. 5 shows a schematic drawing of a quadrature demodulator according to an exemplary embodiment of the present disclosure.

In accordance with an exemplary embodiment, the above method may be implemented using a quadrature demodulator, e.g. using e.g. a quadrature amplitude modulation (QAM). The QAM is a modulation scheme which conveys data by changing the amplitude of the carrier waves. These two waves, usually sinusoids, are out of phase with each other by 90° and are thus called quadrature carriers. The two waves have usually the same frequency. The measurement of the first and second phases $\psi_i(t)$, i=1,2 at the first and second network node, respectively, given the received signals $z_i(t)$, may be implemented by a quadrature demodulator. An example of a quadrature demodulator is shown in FIG. 5. The received signal $z_i(t)$, for example the first signal received at the second network node 120, or the third signal received at the first network node 110, is multiplied (or demodulated) by quadrature signals $\cos(\omega_i t + \psi_i^0)$ and $-\sin(\omega_i t + \psi_i^0)$ and low-pass filtered. The resulting signals are $$u_i^I(t) = \frac{1}{2}\cos(\psi_i(t)) \quad (15)$$

$$u_i^Q(t) = \frac{1}{2}\cos(\psi_i(t)), \quad (16)$$

from which the phase $\psi_i(t)$ is found as the angle of the complex number $u_i(t)$, $u_i(t) = u_i^I(t) + ju_i^Q(t) = \frac{1}{2}e^{j\psi_i(t)}$. Formally, $$\psi_i(t) = \arctan\left(\frac{u_i^Q(t)}{u_i^I(t)}\right). \quad (17)$$

The measurements of the phase difference $\psi_1(t)$ and $\psi_2(t)$ performed at different nodes are combined to yield an estimate of d(t), see for example equation (14). This implies that the measurement values are sent, at an appropriate rate, to a calculation unit. This unit may be located at the first network node 110 or at the second network node 120, in which case the values can be transmitted using the PLC communication link itself. Alternatively, the values can be sent by separate devices to some third unit for processing. In accordance with an exemplary embodiment, the calculation unit can be a processor executing a computer program recorded on a non-transitory computer-readable recording medium. The processor can be a general purpose processor or an application specific processor.

The description above is given in terms of unmodulated carriers. In practice, the PLC signal is modulated by the user data to be transmitted. For accurate phase measurements, this data modulation may be compensated or eliminated.

In accordance with an exemplary embodiment, the phase signal obtained from the quadrature demodulator is low-pass filtered, in order to smooth over the data-induced phase variation.

In accordance with an exemplary embodiment, the signal $z_i(t)$ is squared before demodulation and extracting (bandpass filtering) the component at frequency $2\omega_i$. Quadrature demodulation of the resulting signal yields $2\psi_i(t)$ with most data-dependent contributions removed.

In accordance with an exemplary embodiment, a decision-feedback may be used, e.g., using the data detector to re-modulate and subtract the data-dependent phase contribution.

These schemes may introduce measurement errors which depend on the statistics of the data.

In the following, a numerical example is given for a measurement of a length of a power transmission line.

Assume that d increases from, for example, 100 km to 100.05 km in one minute due to increased thermal loading of 30° C. Hence $\dot{d}$=50 m/60 sec=0.83 m/s. With $f_1$=100 kHz and $f_2$=200 kHz, and a relative frequency error of y=$10^{-6}$ (1 ppm can be achieved by low-cost temperature-controlled quartz oscillators), it follows from equation (10) and equation (11) with $d(t)=d_0+\dot{d}t$ that the frequencies measured at $\psi_1(t)$ and $\psi_2(t)$ are $$\frac{\dot{\psi}_1}{2\pi} = -yf_1 - f_1\frac{\dot{d}}{c} = -104.2 \text{ mHz},$$

$$f_1\frac{\dot{d}}{c} = 0.42 \text{ mHz}$$

$$\frac{\dot{\psi}_2}{2\pi} = +yf_2 - f_2\frac{\dot{d}}{c} = +191.7 \text{ mHz},$$

$$f_2 \frac{\dot{d}}{c} = 0.83 \text{ mHz}$$

(with $c = 2 \cdot 10^8$ m/s). It is seen that contribution due to the oscillator frequency offset may be considerably larger than the frequency due to the length change of the power line. Precise measurement of the phases is thus crucial to obtain accurate length estimates from equation (13).

In accordance with an exemplary embodiment instead of using bi-directional measurements as described above, it also possible to use two co-directional links from the first network node 110 to the second network node 120, using different frequencies $f_1 \neq f_2$. In this case, the sign of the measured frequency offsets at frequencies $f_1$ and $f_2$ are equal, and a similar derivation as above yields $$\hat{d} = -\frac{\frac{\psi_1}{\omega_1} + \frac{\psi_2}{\omega_2}}{\frac{1}{c_1} - \frac{1}{c_2}}. \tag{18}$$

However, this method fails if the propagation speeds $c_1$ and $c_2$ for the two frequencies are equal, as is true for lossless lines. Hence, this method may be sensitive to measurement errors.

In accordance with an exemplary embodiment, which may be combined with other embodiments described herein, the power transmission line length may be separately directly measured, to provide an approximate length of the power transmission line. As explained, the estimate $\hat{d}(t)$ does not give an absolute length. For example, a direct delay measurement may be used. After performing this direct delay measurement for obtaining a rough estimate of the length of the powerline, the carrier phase measurement method described above is then employed to deliver relative length measurements of higher accuracy and resolution. The delay measurement method relies on "two-way measurements" of message delay between first network node 110 and the second network node 120.

At time T1 (as measured by the clock on node 1), node 1 sends a message to node 2. Node 2 measures its arrival time as T2 (measured by the clock on node 2). Then, at time T3 (measured by the clock on node 2), node 2 in turns sends a message to node 1, which measures its arrival time as T4 (measured by the clock in node 1). Assuming that the message delay $\tau$ is the same in both directions, $$d = \frac{\tau}{c} = \frac{1}{c} \frac{(T4 - T1) - (T3 - T2)}{2}. \tag{19}$$

This is a variant of the round trip delay measurement (T4–T1), corrected by the processing time (T3–T2) in node 2. Due to processing time jitter and to the lower frequency content of the data signal carrying the messages, such message delay measurements are considerably less accurate and have much lower resolution than the carrier phase method described above. For example, a (low) message delay measurement jitter of 10 μs translates to a length error of 2 km, as compared with a 1° resolution of phase measurements corresponding to length resolution of about 5 m.

Figure 6:
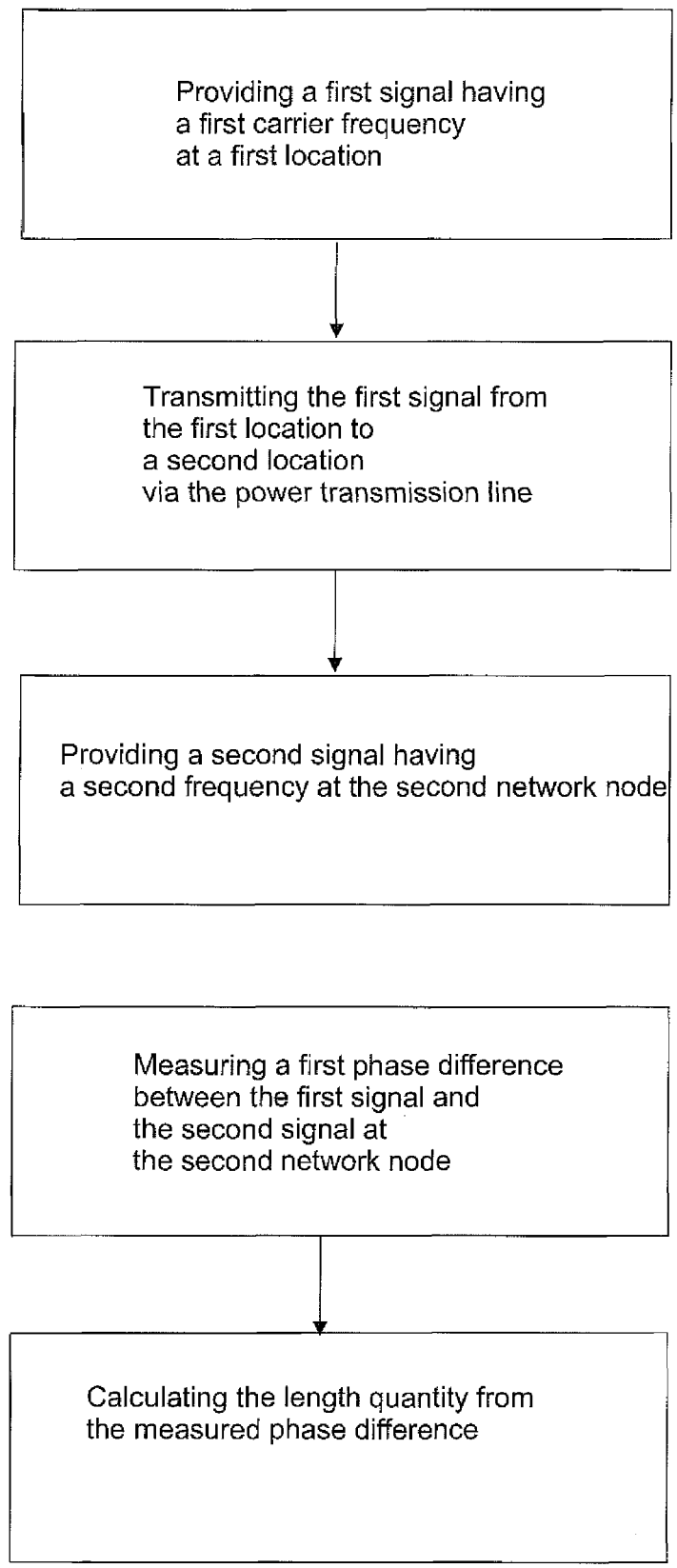
FIG. 6 is a flowchart diagram of a method for estimating the length of a power transmission line according to an exemplary embodiment of the present disclosure.

FIG. 6 shows an exemplary embodiment of a method that may be used for performing a measurement of a length quantity of a power transmission line between a first location and a second location. In a first step, a first signal is provided having a first carrier frequency at a first network node. In a further step, the first signal is transmitted from the first location to the second location via the power transmission line. In a further step, a second signal is provided having a second frequency at the second network node. In another step, a first phase difference between the first signal and the second signal is measured at the second network node, e.g., by a processor of a computer processing device at the node or remote from the node. Finally, the length quantity from the measured phase difference is calculated, e.g., by the processor of the computer processing device.

The written description uses examples to illustrate exemplary embodiments of the present disclosure, including the best mode, and also to enable any person skilled in the art to make and use the various embodiments of the present disclosure. While the disclosure has been described in terms of various specific embodiments, those skilled in the art will recognize that the disclosure can be practiced with modifications within the spirit and scope of the claims. Especially, mutually non-exclusive features of the embodiments described above may be combined with each other. The patentable scope of the disclosure is defined by the claims, and may include other examples that occur to those skilled in the art. Such other examples are intended to be within the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for determining a length quantity of a power transmission line, wherein the power transmission line connects a first location with a second location, wherein the method comprises:
   providing a first signal having a first carrier frequency at the first location;
   transmitting the first signal from the first location to the second location via the power transmission line;
   providing a second signal having a second frequency at the second location;
   measuring a first phase difference between the first signal and the second signal at the second location; and
   calculating, in a processor of a computer processing device, the length quantity from the measured first phase difference.

2. The method according to claim 1, wherein the first signal is a power line communication signal such that modulated user data is at least one of compensated and eliminated.

3. The method according to claim 2, wherein the second frequency is equal to the first carrier frequency, and
   wherein frequency generators for generating the first carrier frequency at the first location and the second frequency at the second location are synchronized.

4. The method according to claim 2, wherein the second frequency is equal to the first carrier frequency, and
   wherein a phase and frequency of frequency generators for generating the first carrier frequency at the first location and the second frequency at the second location are synchronized.

5. The method according to claim 2, comprising:
providing a third signal with a third carrier frequency;
transmitting the third signal from the second location to the first location;
providing a fourth signal having a fourth frequency at the second location; and
measuring a second phase difference between the third signal and the fourth signal at the second location.

6. The method according to claim 5, comprising:
generating the first carrier frequency and the fourth frequency at the first location from the same local frequency source having a first base frequency; and
generating the third carrier frequency and the second frequency from the same local frequency source having a second base frequency.

7. The method according to claim 6, wherein:
at least one of the first carrier frequency and the fourth frequency is a multiple or a fraction of the first base frequency, respectively; and
at least one of the third carrier frequency and the second frequency is a multiple or a division of the second base frequency, respectively.

8. The method according to claim 5, wherein at least one of the first carrier frequency and the third carrier frequency is in the range of 10 kHz to 2000 kHz.

9. The method according to claim 8, wherein at least one of the first carrier frequency and the third carrier frequency is in the range of 20 kHz to 1000 kHz.

10. The method according to claim 8, wherein at least one of the first carrier frequency and the third carrier frequency is in the range of 40 kHz to 500 kHz.

11. The method according to claim 5, comprising:
calculating the length of the power transmission line based on at least one of the measured first phase difference and the measured second phase difference.

12. The method according to claim 5, wherein the length quantity is one of the total length and a relative change in length.

13. The method according to claim 1, wherein the second frequency is equal to the first carrier frequency, and
wherein frequency generators for generating the first carrier frequency at the first location and the second frequency at the second location are synchronized.

14. The method according to claim 1, wherein the second frequency is equal to the first carrier frequency, and
wherein a phase and frequency of frequency generators for generating the first carrier frequency at the first location and the second frequency at the second location are synchronized.

15. The method according to claim 1, comprising:
providing a third signal with a third carrier frequency;
transmitting the third signal from the second location to the first location;
providing a fourth signal having a fourth frequency at the second location; and
measuring a second phase difference between the third signal and the fourth signal at the second location.

16. The method according to claim 15, comprising:
generating the first carrier frequency and the fourth frequency at the first location from the same local frequency source having a first base frequency; and
generating the third carrier frequency and the second frequency from the same local frequency source having a second base frequency.

17. The method according to claim 16, wherein:
at least one of the first carrier frequency and the fourth frequency is a multiple or a fraction of the first base frequency, respectively; and
at least one of the third carrier frequency and the second frequency is a multiple or a division of the second base frequency, respectively.

18. The method according to claim 15, comprising:
calculating the length of the power transmission line based on at least one of the measured first phase difference and the measured second phase difference.

19. The method according to claim 1, wherein the first carrier frequency is in the range of 10 kHz to 2000 kHz.

20. The method according to claim 19, wherein the first carrier frequency is in the range of 20 kHz to 1000 kHz.

21. The method according to claim 19, wherein the first carrier frequency is in the range of 40 kHz to 500 kHz.

22. The method according to claim 1, wherein the length quantity is one of the total length and a relative change in length.

23. The method according to claim 1, wherein the first carrier frequency is an unmodulated carrier of a power line communication system.

24. A system for determining the length of a power transmission line between a first location and a second location, the system comprising:
a second receiver at the second location configured to receive a first signal having a first carrier frequency from the first location; and
a first frequency generator configured to create a second signal having a second frequency at the second location,
wherein the second receiver comprises a phase detection device configured to detect a first phase difference between the second frequency and the first carrier frequency at the second location.

25. The system according to claim 24, comprising:
a second transmitter at the second location having a second frequency generator configured to create a third carrier frequency of a third signal,
wherein the transmitter is configured to send the third signal via the power transmission line to the first location.

26. The system according to claim 25, wherein the second receiver at the second location and the second transmitter at the second location are configured to use a common frequency source to create the third carrier frequency for the third signal and to create the second signal,
wherein the common frequency source has a second base frequency, and
wherein at least one of (i) the third carrier frequency of the third signal is one of a multiple and a fraction of the second base frequency, and (ii) the second frequency is one of a multiple and a fraction of the second base frequency.

27. The system according to claim 26, comprising:
a first receiver at the first location configured to receive the third signal from the second location;
a fourth frequency generator at the first location for creating a fourth signal having a fourth frequency; and
a phase detection device configured to detect a second phase difference between the fourth frequency and the third carrier frequency.

28. The system according to claim 27, comprising:
a first transmitter at the first location having a first frequency generator configured to create the first carrier frequency of a first signal, wherein the first receiver and the first transmitter at the first location are configured to use a common frequency source to create the first carrier frequency for the first signal and to create the fourth signal, wherein the common frequency source has a first base frequency, and wherein at least one of (i) the first carrier frequency of the first signal is one of a multiple and a fraction of the first base frequency, and (ii) the fourth frequency is one of a multiple or a fraction of the first base frequency.

29. The system according to claim 25, comprising:

a first receiver at the first location configured to receive the third signal from the second location;

a fourth frequency generator at the first location configured to create a fourth signal having a fourth frequency; and a phase detection device configured to detect a second phase difference between the fourth frequency and the third carrier frequency.

30. The system according to claim 29, comprising:

a first transmitter at the first location having a first frequency generator configured to create the first carrier frequency of a first signal, wherein the first receiver and the first transmitter at the first location are configured to use a common frequency source to create the first carrier frequency for the first signal and to create the fourth signal, wherein the common frequency source has a first base frequency, and wherein at least one of (i) the first carrier frequency of the first signal is one of a multiple and a fraction of the first base frequency, and (ii) the fourth frequency is one of a multiple or a fraction of the first base frequency.

* * * * *